(12) United States Patent
Lin et al.

(10) Patent No.: US 10,790,124 B2
(45) Date of Patent: Sep. 29, 2020

(54) METHODS FOR REMOVING PARTICLES FROM ETCHING CHAMBER

(71) Applicant: Taiwan Semiconductor Manufacturing Company, Ltd., Hsinchu (TW)

(72) Inventors: Yu Chao Lin, Hsinchu (TW); Yuan-Ming Chiu, Taipei (TW); Ming-Ching Chang, Hsinchu (TW); Hsin-Yi Tsai, Hsinchu (TW); Chao-Cheng Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 46 days.

(21) Appl. No.: 15/942,841

(22) Filed: Apr. 2, 2018

(65) Prior Publication Data
US 2018/0226235 A1    Aug. 9, 2018

Related U.S. Application Data

(62) Division of application No. 15/164,509, filed on May 25, 2016, now Pat. No. 9,934,945, which is a division
(Continued)

(51) Int. Cl.
*H01J 37/32* (2006.01)
*H01L 21/3213* (2006.01)
(Continued)

(52) U.S. Cl.
CPC .. *H01J 37/32862* (2013.01); *H01J 37/32009* (2013.01); *H01J 37/3244* (2013.01); *H01J 37/32449* (2013.01); *H01J 37/32477* (2013.01); *H01J 37/32633* (2013.01); *H01L 21/3065* (2013.01); *H01L 21/32135* (2013.01); *H01L 21/32136* (2013.01); *H01L 21/67069* (2013.01); *H01J 2237/334* (2013.01)

(58) Field of Classification Search
CPC ............ H01J 37/32862; H01J 37/3244; H01J 37/32009; H01J 37/32633; H01J 37/32477; H01J 37/32449; H01J 2237/334; H01L 21/3065; H01L 21/32136; H01L 21/67069; H01L 21/32135; H01L 21/30655; H01L 21/02
USPC ........................ 118/715; 156/345.33, 345.34
See application file for complete search history.

(56) References Cited

U.S. PATENT DOCUMENTS

| | | | |
|---|---|---|---|
| 7,204,913 B1 * | 4/2007 | Singh ................. | C23C 16/4404 118/724 |
| 2004/0129218 A1 * | 7/2004 | Takahashi ......... | H01J 37/32834 118/715 |

(Continued)

FOREIGN PATENT DOCUMENTS

| EP | 0648858 A1 | 4/1995 |
|---|---|---|
| KR | 20080044487 A | 5/2008 |

(Continued)

*Primary Examiner* — Rudy Zervigon
(74) *Attorney, Agent, or Firm* — Slater Matsil, LLP (57) ABSTRACT

A method includes forming a coating layer in a dry etching chamber, placing a wafer into the dry etching chamber, etching a metal-containing layer of the wafer, and moving the wafer out of the dry etching chamber. After the wafer is moved out of the dry etching chamber, the coating layer is removed.

20 Claims, 8 Drawing Sheets

Related U.S. Application Data of application No. 14/273,827, filed on May 9, 2014, now Pat. No. 9,355,823.

(51) Int. Cl.
*H01L 21/67* (2006.01)
*H01L 21/3065* (2006.01)

(56) References Cited

U.S. PATENT DOCUMENTS

| | | |
|---|---|---|
| 2004/0224128 A1 | 11/2004 | Chang et al. |
| 2007/0207267 A1 | 9/2007 | Laube |
| 2011/0259519 A1 | 10/2011 | Kenworthy et al. |
| 2015/0325417 A1 | 11/2015 | Lin et al. |
| 2016/0314982 A1* | 10/2016 | Kihara ................ H01L 21/3065 |

FOREIGN PATENT DOCUMENTS

| | | |
|---|---|---|
| KR | 20090037472 A | 4/2009 |
| KR | 20140045147 A | 4/2014 |

* cited by examiner

METHODS FOR REMOVING PARTICLES FROM ETCHING CHAMBER

PRIORITY CLAIM AND CROSS-REFERENCE

This application is a divisional of U.S. patent application Ser. No. 15/164,509, entitled "Methods for Removing Particles from Etching Chamber," filed May 25, 2016, which is a divisional of U.S. patent application Ser. No. 14/273,827, entitled "Methods for Removing Particles from Etching Chamber," filed on May 9, 2014, now U.S. Pat. No. 9,355,823 issued May 31, 2016, which applications are incorporated herein by reference.

BACKGROUND

The formation of integrated circuit often involves etching metal layers. For example, aluminum-containing gate electrodes and aluminum copper pads are commonly seen integrated circuit components. These components are formed by depositing a blanket metal layer, and then patterning the blanket metal layer as desirable patterns using an etching process.

The etching of the metal layer may be performed in a dry etching chamber, which is vacuumed, and etching gases are introduced into the etching chamber to etch the metal layer. In the etching process, plasma is generated from the etching gases. The metal ions in the metal layer may sometimes react with the ions in the etching gases to form particles. For example, when aluminum is etched, the aluminum ions may react with fluorine ions to form aluminum fluorine (AlF) particles, which stick to the inner surface of the etching chamber. The bonding of the AlF particles to the inner surface of the etching chamber, however, is weak. Hence, the bonds between the AlF particles and the inner surface may break, and the AlF particles fall on wafers, causing manufacturing yield to drop.

AlF has a high vaporizing temperature. Hence, it is difficult to remove the AlF particles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A dry etching process and the corresponding particle removal process are provided in accordance with various exemplary embodiments. The intermediate stages of performing the dry etching and the particle-removal and metal clean processes are illustrated. The apparatus for the dry etching and removing the particles is also illustrated. The variations of the embodiments are discussed. Throughout the various views and illustrative embodiments, like reference numbers are used to designate like elements.

Figure 1:
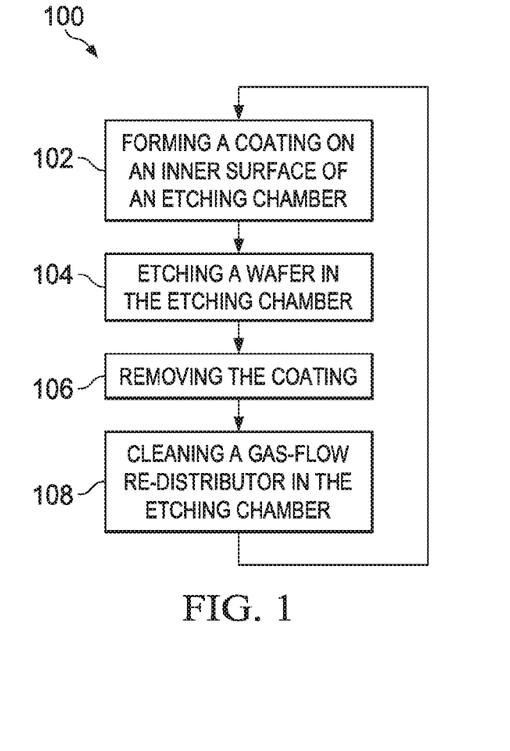
FIG. 1 illustrates a process flow in accordance with some embodiments.

FIG. 1 illustrates process flow 100 for etching a wafer in a dry etching chamber, the corresponding process for forming and removing a coating layer, and a metal cleaning process in accordance with some embodiments. The process flow as shown in FIG. 1 is also discussed in detail referring to the process steps shown in FIGS. 4 through 8. A brief discussion is provided as follows. First, a coating layer is deposited in an etching chamber of a production tool (step 102). The coating layer may be deposited in the locations over a wafer station, on which a wafer is to be disposed in a subsequent step. The wafer is then etched (step 104), during which the undesirable metal particles may be generated. The coating layer includes the material that can bond with the metal particles formed in subsequent steps. Accordingly, the coating layer acts as a glue layer for "adhering" the metal particles, so that it is difficult for the metal particles to fall on the wafer, and hence the manufacturing yield is improved. The coating layer is then removed (step 106) from the chamber, and the metal particles are also removed from the chamber along with the coating layer. Next, a gas-flow redistributor is also cleaned to remove the metal particles thereon. Steps 102 through 108 may be repeated for the etching of each of wafers.

Figure 2:
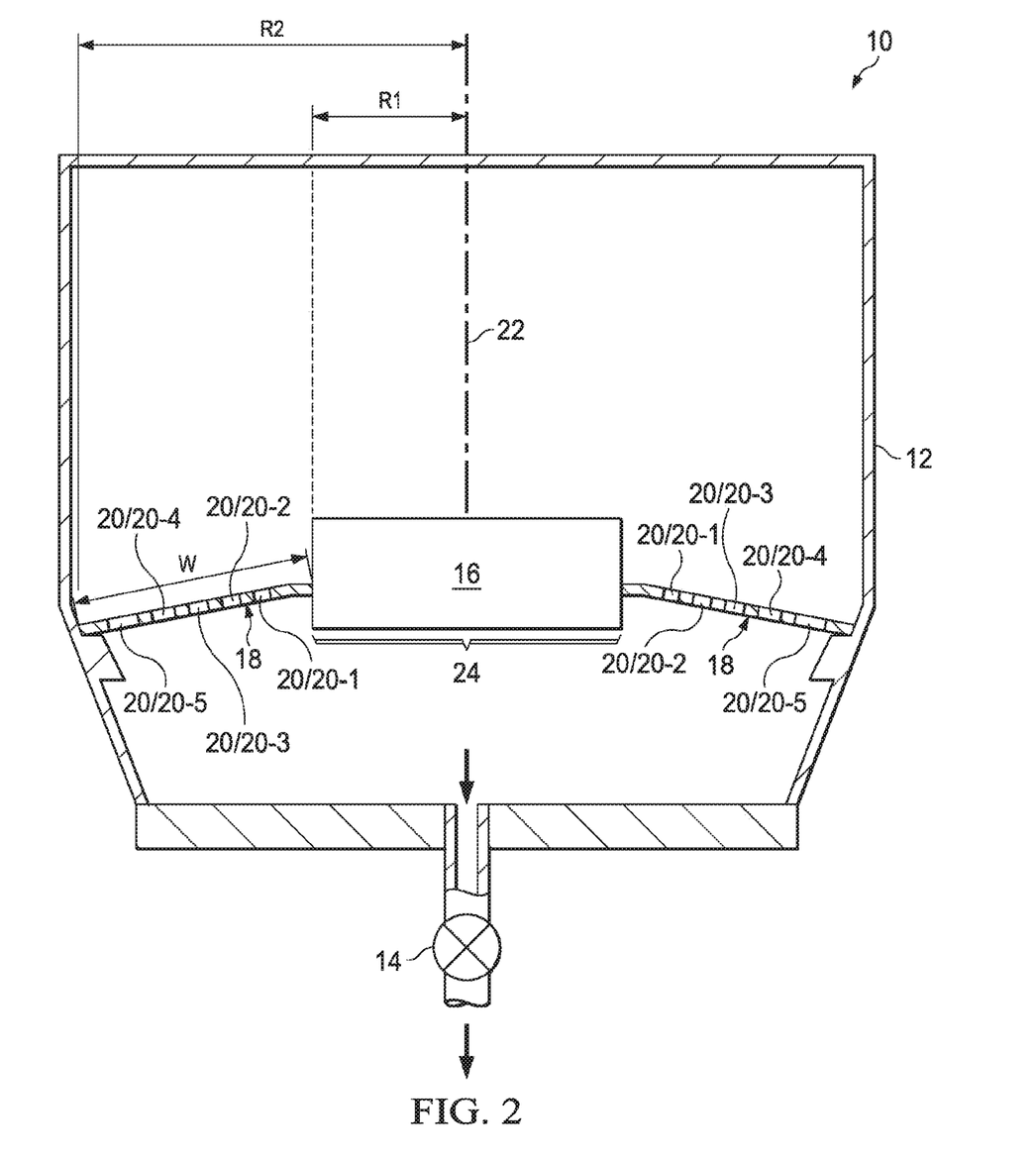
FIG. 2 illustrates a cross-sectional view of a dry etching tool in accordance with some embodiments.

FIG. 2 illustrates a cross-sectional view of etching tool 10, which includes etching chamber 12. Etching tool 10 is configured to be used for dry etching processes, in which gases rather than wet etching solutions are used for etching wafers. Etching chamber 12 is configured to be vacuumed, for example, through pump 14, through which the air and/or process gases in etching chamber 12 are evacuated. Wafer station 16 is located in chamber 12. In some embodiments, wafer station 16 is an electrical Chuck (E-Chuck), which is configured to secure a wafer thereon through an electrical force.

Gas-flow re-distributor 18 is mounted in chamber 12 to separate chamber 12 into a top portion over gas-flow re-distributor 18, and a bottom portion under gas-flow re-distributor 18. Gas-flow re-distributor 18 is used to force the gas overlying wafer station 16 to flow through the through-holes 20 in gas-flow re-distributor 18, so that the distribution of the gas flow is more uniform. For example, gas-flow re-distributor 18 may include a plurality of through-holes 20 aligned to a plurality of concentric rings (also refer to FIG. 3). The concentric rings have center 22, which is also the center of wafer station 16. The through-holes (such as 20-1, 20-2, 20-3, 20-4, or 20-5) aligned to the same concentric ring may have the same size (area) and/or the same shape. Furthermore, the through-holes (such as 20-1) aligned to the inner concentric rings that are closer to the center 22 have diameters smaller than the through-holes (such as 20-5) aligned to the outer concentric rings that are farther away from the center 22. In some exemplary embodiments, with the increase in the distance between through-holes 20 and center 22, the sizes (areas) of the respective through-holes 20 increase gradually. Alternatively stated, the through-holes 20 aligned to each of the outer concentric rings may have sizes greater than the through-holes 20 that are aligned the through-holes 20 that are aligned to respective inner concentric rings.

Figure 3:
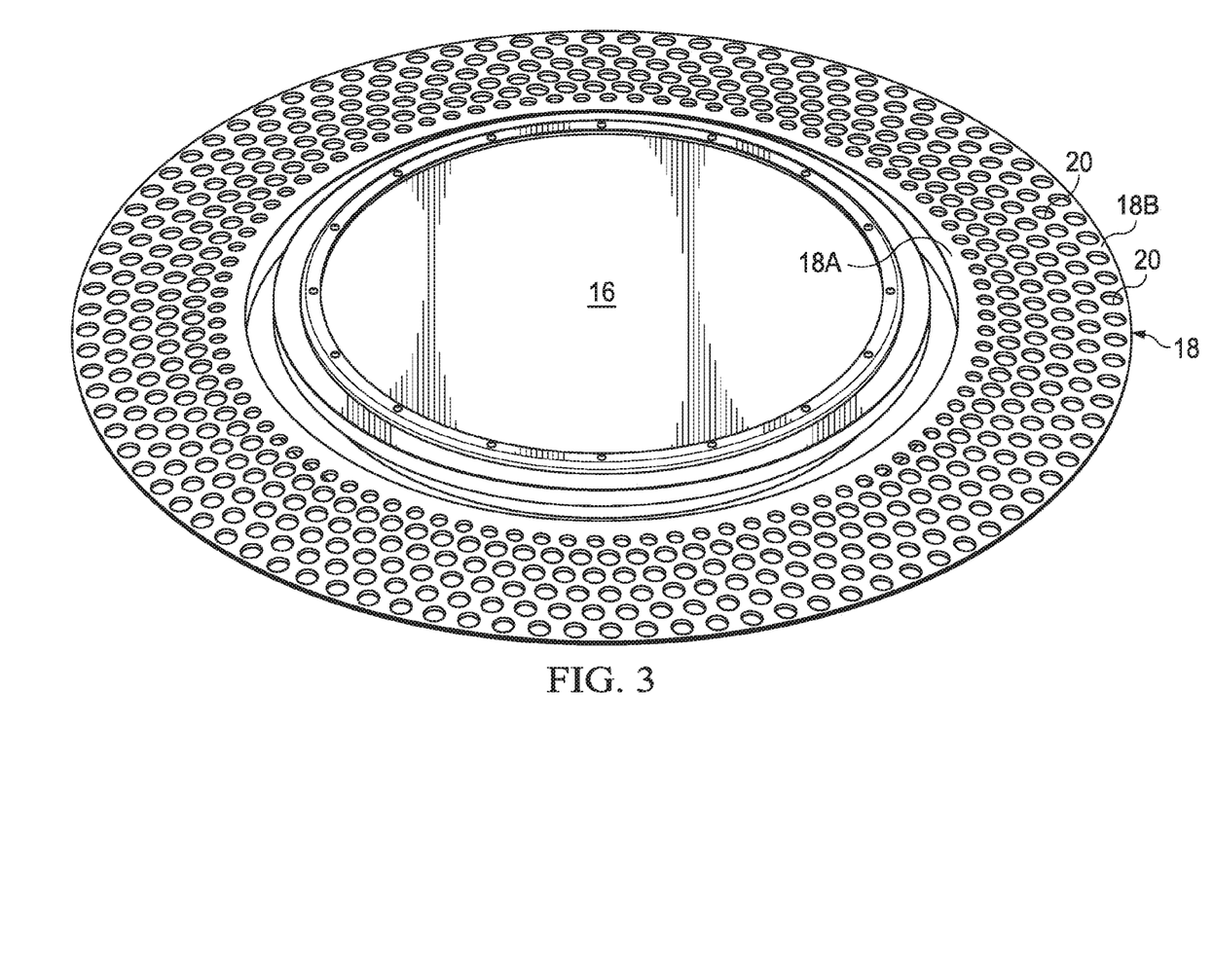
FIG. 3 illustrates a perspective view of a gas-flow redistributor mounted in a dry etching chamber in accordance with some embodiments.

In some embodiments, through-holes 20 are aligned to five (or more or fewer) concentric rings, with the corresponding through-holes 20 denoted as 20-1, 20-2, 20-3, 20-4, and 20-5, with 20-1 being the innermost through-holes, and 20-5 being the outmost through-holes. Through-holes 20 may have round top-view shapes, for example, as illustrated in FIG. 3. Alternatively, through-holes 20 may have any other top-view shapes such as polygon shapes. In some exemplary embodiments, through-holes 20-1 have a diameter in the range between about 5 mm and about 10 mm, through-holes 20-2 have a diameter in the range between about 10 mm and about 13 mm, through-holes 20-3 have a diameter in the range between about 13 mm and about 15 mm, through-holes 20-4 have a diameter in the range between about 15 mm and about 18 mm, and through-holes 20-5 have a diameter in the range between about 18 mm and about 20 mm. It is appreciated, however, that the values recited throughout the description are merely examples, and may be changed to different values.

Figure 6:
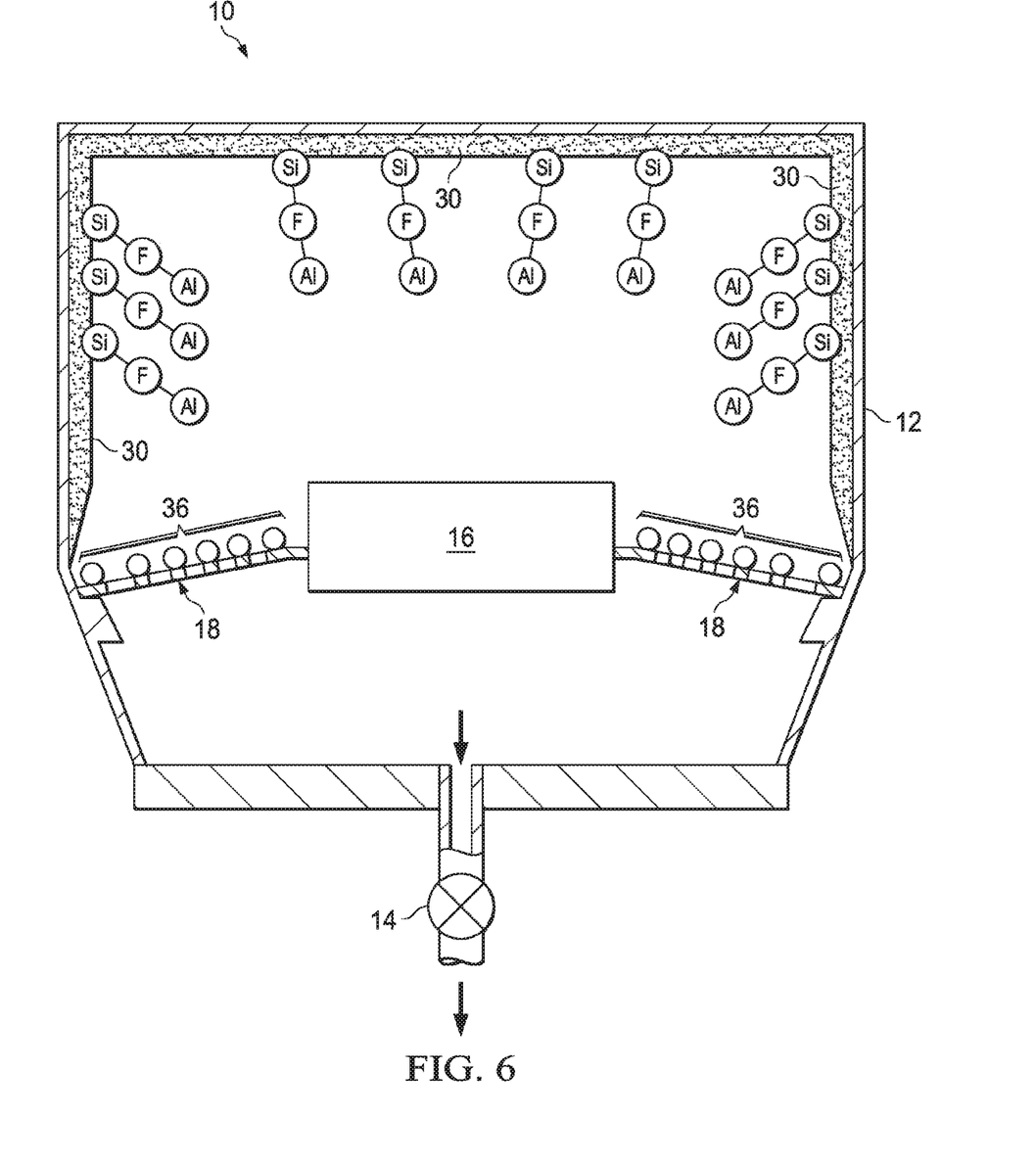

With the inner through-holes 20 having smaller sizes than the outer through-holes 20, the gas flow resistance for process gas or air flowing through the inner through-holes is greater than the gas flow resistance for the process gas or air flowing through the outer through-holes. Since pump 14 is aligned to center 22, the gas/air in the region over wafer station 16 tends to flow through the paths closer to wafer station 16 faster. Therefore, by increasing the gas flow resistance of the inner paths closer to wafer station 16, more gas/air is diverted to flow through the outer paths farther away from wafer station 16. By selecting appropriate sizes for through-holes, as described in the embodiments of the present disclose, the gas/air flow is substantially uniform, and the back-stream of the gas/air, which back-stream flows upwardly in certain regions, is eliminated. Since the back-stream may cause more metal particles that are generated by the etching of wafers (as shown in FIG. 6) to fall on wafers, eliminating the back-stream may improve the yield of wafers.

As shown in FIG. 3, gas-flow re-distributor 18 has a ring shape (in the top view) with inner edge 18A and outer edge 18B. The body of gas-flow re-distributor 18 is between inner edge 18A and outer edge 18B. Both inner edge 18A and outer edge 18B form concentric rings. The inner edge 18A defines opening 24 (FIG. 2) therein, with wafer station 16 residing in opening 24. As shown in FIG. 2, in some embodiments, opening 24 has radius R1, which may be in the range between about 140 mm and about 160 mm. The radius R2 of the outer edge of gas-flow re-distributor 18 may be in the range between about 280 mm and about 330 mm. The distance between the inner edge and the outer edge may be in the range between about 140 mm and about 170 mm. Gas-flow re-distributor 18 may include anodized aluminum as a base material, with $Y_2O_3$ coated on the surfaces of the base material. The thickness of gas-flow re-distributor 18 may be in the range between about 5 mm and about 15 mm.

FIG. 3 illustrates a perspective view of wafer station 16 and gas-flow re-distributor 18 in accordance with some embodiments, wherein inner edge 18A and the outer edge 18B of gas-flow re-distributor 18 are marked. Through-holes 20 are located between inner edge 18A and outer edge 18B. The size difference between some of through-holes 20 are also schematically illustrated in FIG. 3. Gas-flow re-distributor 18 may be electrically grounded. It is appreciated that the sizes of through-holes 20 are schematic, and the optimum sizes of through-holes 20 may be different from what is shown.

Figure 4:
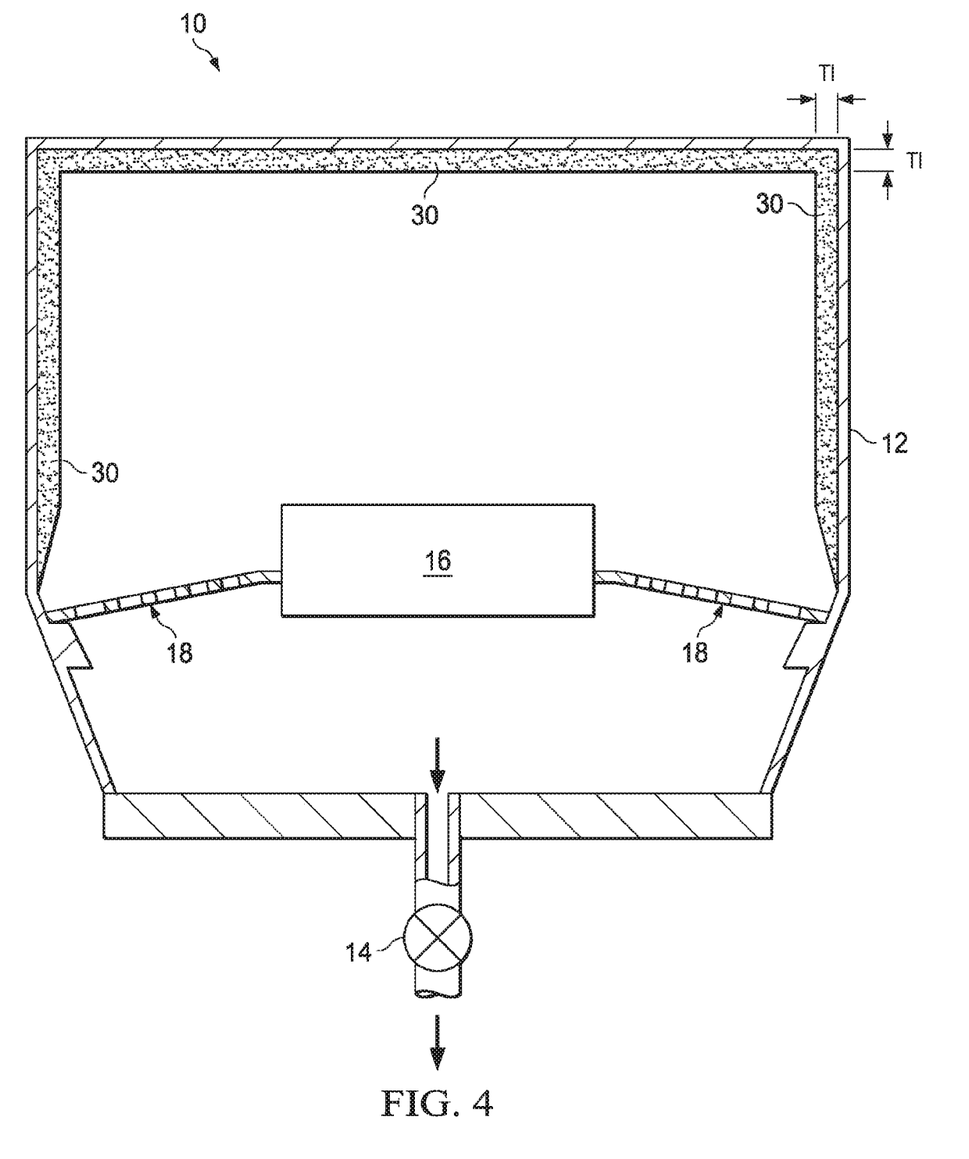
FIGS. 4 through 8 illustrate the cross-sectional views of intermediate stages in the etching of a metal layer in a wafer in accordance with some embodiments, wherein a coating layer is formed and removed.

FIGS. 4 through 8 illustrate a production cycle in accordance with some embodiments of the present disclosure. Referring to FIG. 4, coating layer 30 is deposited on the inner surface of chamber 12. The respective step is shown as step 102 in process flow 100 of FIG. 1. Coating layer 30 is also deposited in the region over wafer station 16 and gas-flow re-distributor 18, and not in the region underlying wafer station 16 and gas-flow re-distributor 18. In some embodiments, coating layer 30 comprises a silicon-based material, which may be a silicon-based oxide. For example, coating layer 30 may include $SiClO_x$ and/or $SiO_x$, wherein x is the number of oxygen atoms in the respective molecule. Value x may be 3 or 4 for $SiClO_x$, or 1 or 2 for $SiO_x$.

When coating layer 30 is to comprise $SiClO_x$, with x being 3 or 4, the respective process gases used for forming coating layer 30 may include $SiCl_4$ and oxygen ($O_2$). Argon may or may not be included. $SiCl_4$ and oxygen react to form $SiClO_x$, wherein more oxygen results in more $SiClO_4$ and less $SiClO_3$, and vice versa. On the other hand, when coating layer 30 is to comprise $SiO_x$, wherein x may be 1 or 2, the respective process gases may include $SiH_4$ and oxygen ($O_2$), and argon may or may not be included. $SiH_4$ and oxygen react to form $SiO_x$, wherein more oxygen results in more $SiO_2$ and less SiO, and vice versa.

In the process for forming coating layer 30, the process gases are introduced into chamber 12, and are in-situ reacted. In some exemplary coating process, the pressure of the processes is in the range between about 10 mTorr and about 30 mTorr, which is considered as a high pressure because in similar deposition processes, a pressure higher than about 5 mTorr is typically considered as a high pressure. The power for the reaction may be in the range between about 500 Watts and about 1,500 Watts. The flow rate of argon may be in the range between about 10 sccm and about 50 sccm. The flow rate of $SiCl_4$ may be in the range between about 100 sccm and about 300 sccm. The flow rate of $O_2$ may be in the range between about 50 sccm and about 100 sccm. The reaction time may be in the range between about 10 seconds and about 20 seconds. Thickness T1 of the coating layer 30 on the top inner surface and the top parts of the sidewalls may be in the range between about 5 Å and about 50 Å.

Figure 5:
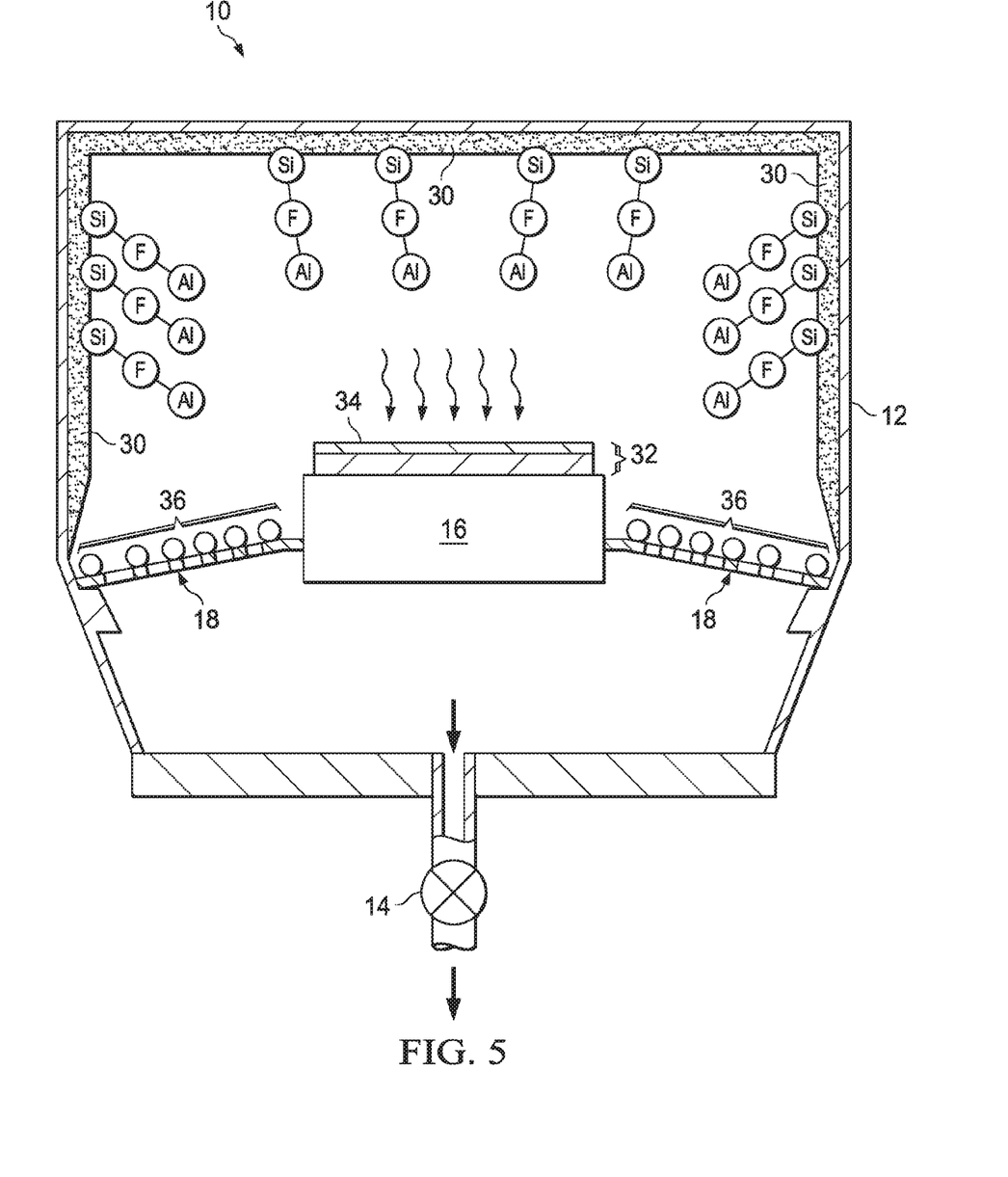

The "high" pressure used in the coating process will reduce the mean free path and prolong gas residence time of the reaction gas, so that the radicals of the reaction gases may survive longer. As a result, coating layer 30 is mainly deposited on the upper portions (of the region over wafer station 16) of the inner surface of chamber 12, while in the lower portions (of the region over wafer station 16), the thickness of coating layer 30 is small. There may be a transition region, as illustrated, in which the thickness of coating layer 30 reduces gradually. The transition region may occur, for example, at approximately the same level as wafer 32 (FIG. 5). This may ensure that at the level higher than wafer 32, the thickness of coating layer 32 is adequate to cover the upper portion of the inner surface of chamber 12 without leaving any portion uncovered. Since the metal particles adhered to the lower portions (of inner surface of chamber 12) that are lower than wafer 32 are not able to fall on wafer 32, the quality and the coverage of coating layer 30 in the lower portions of the etching chamber do not adversely affect the effect of coating layer 30. Coating layer 30 may or may not be deposited on gas-flow re-distributor 18 since its position is low. The coating layer 30 on gas-flow re-distributor 18, if any, may be very thin.

FIG. 5 illustrates the etching of wafer 32 in etching tool 10. The respective step is shown as step 104 in the process flow 100 of FIG. 1. Wafer 32 is placed on, and is secured on, wafer station 16. A dry etching process is performed on surface layer 34 of wafer 32. Surface layer 34 is a metal-containing layer comprising a metal such as aluminum (Al), aluminum copper (AlCu), TaAlC, TiAlC, or the like, which is an aluminum-containing metal layer in accordance with some embodiments. Surface layer 34 may be any metal layer that is used in the integrated circuit manufacturing processes. For example, the metal layer may include, and is not limited to, metal gates, metal contact plugs, a metallization layer in low-k dielectric layers, aluminum copper metal pads over the top metallization layer, post passivation interconnections, under-bump metallurgies, metal pads, and so on. In alternative embodiments, metal-containing layer 34 may also be aluminum-free. The etching gas is thus chosen according to the material of metal-containing layer 34. In some exemplary embodiments, the pressure of the etching gas (such as $Cl_2$, $BCl_3$, and/or oxygen ($O_2$)) is in the range between about 1 mTorr and about 5 mTorr. The power for the etching may be in the range between about 300 Watts and about 1,000 Watts, with the voltage of the power source being in the range between about 50 volts and about 200 volts. The flow rate of $Cl_2$ may be in the range between about 30 sccm and about 100 sccm. The flow rate of $BCl_3$ may be in the range between about 20 sccm and about 50 sccm. The flow rate of $O_2$ may be in the range between about 2 sccm and about 10 sccm.

In the etching process, the residue metal ions of metal-containing layer 34, such as Al ions, may remain in chamber 12, which may be caused by the sputtering resulted from the plasma used in the metal etching process. In a subsequent process, an in-situ metal cleaning may be performed, for example, using a fluorine-containing gas (such as $SF_6$) as a cleaning gas for removing the residue ions. In the exemplary metal cleaning process, $SF_6$ is introduced into chamber 12. The fluorine ions react with the metal ions such as Al ions to generate metal particles. The metal particles, such as aluminum fluoride (AlF) particles, are attached to coating layer 30, as illustrated in FIG. 5. The silicon-containing coating layer 30 includes positively charged silicon ions, which bond with the negatively charged fluorine ions in AlF to generate Si—F bonds. Fluorine ions are further bonded to the aluminum ions. Accordingly, through the Si—F bonds, the AlF particles are adhered to coating layer 30. An advantageously feature of the embodiments of the present disclosure is that the Si—F bonds are strong bonds, which do not break easily. Accordingly, it is unlikely that the AlF particles will fall on wafer 32. As a comparison, although the inner surface material of the chamber 12 may sometimes contain quartz, which includes silicon, the silicon atoms in quartz have weak bonds to the F ions in AlF, wherein the weak bonds may easily break. Accordingly, the AlF particles may fall on the wafers in chamber 12 if coating layer 30 is not formed.

In some embodiments, the AlF particles may also be adhered to gas-flow re-distributor 18, which is illustrated as 36 in FIG. 5. The Y (yttrium) atoms in gas-flow re-distributor 18 also have the function of bonding to the AlF particles. It is appreciated that the bonding between the AlF particles and gas-flow re-distributor 18 may not be as strong as the bonding between the AlF particles and coating layer 30. However, since the position of gas-flow re-distributor 18 is lower than wafer 32, any fallen metal particles will be evacuated by pump 14 without being able to fall on wafer 32. Accordingly, the metal particles on gas-flow re-distributor 18 will not be able to affect the manufacturing yield.

Wafer 32 is then moved out of chamber 12, and the resulting etching tool 10 is illustrated in FIG. 6. The resulting chamber 12 includes the AlF particles on coating layer 30 and gas-flow re-distributor 18.

Figure 7:
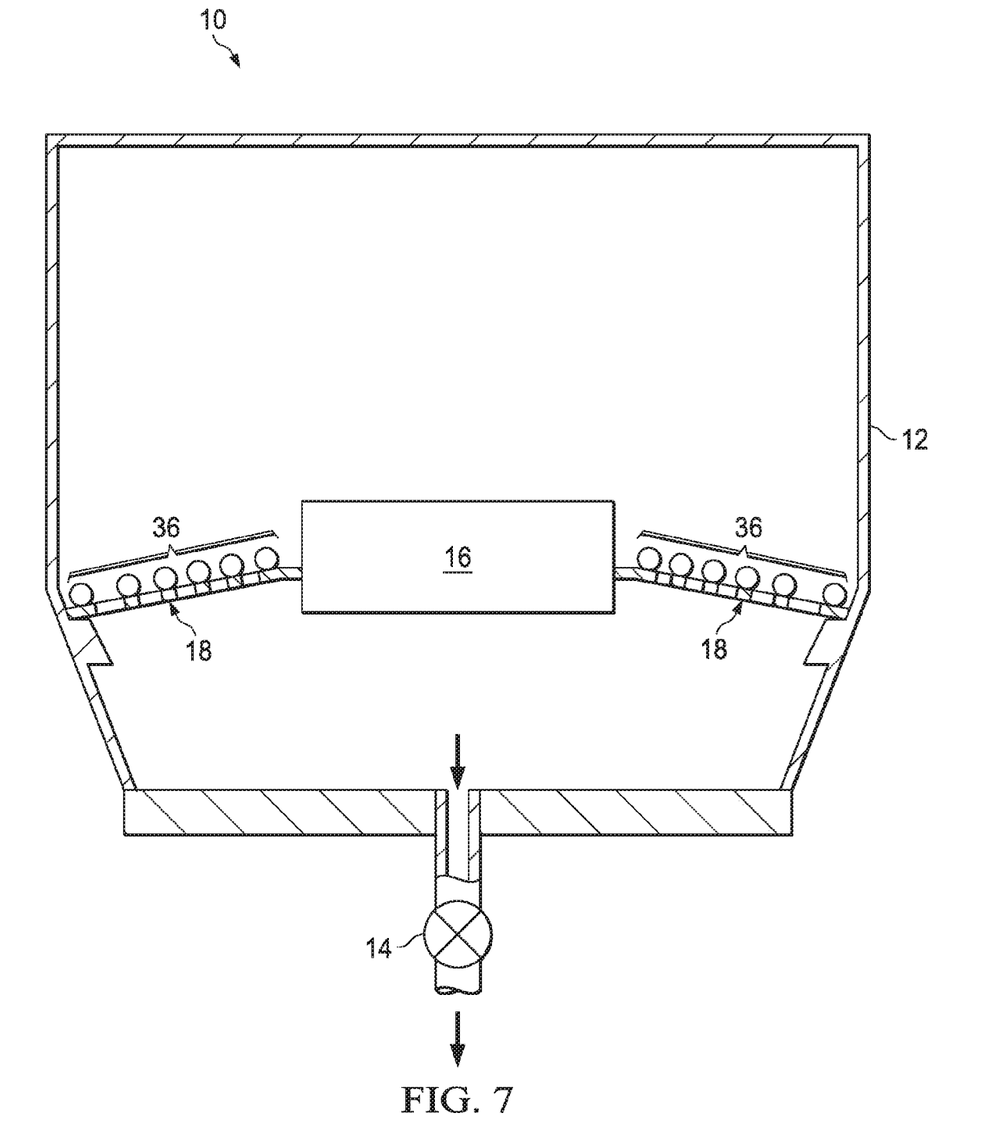

Coating layer 30 is then removed in an in-situ etching step, and the resulting etching tool 10 is shown in FIG. 7. The respective step is shown as step 106 in the process flow 100 of FIG. 1. Advantageously, the AlF particles attached on coating layer 30 are removed along with the removal of coating layer 30. The coating removal may be performed using etching gas such as $NF_3$ or other process gases that may be used to etch coating layer 30, depending on the material of coating layer 30. When coating layer 30 comprises materials other than silicon-based oxides, different process gases may be used. Argon may or may not be added. In some exemplary embodiments, the pressure of the etching gas (such as $NF_3$) is in the range between about 100 mTorr and about 300 mTorr. The power for the etching may be in the range between about 800 Watts and about 1,500 Watts. The flow rate of $NF_3$ may be in the range between about 500 sccm and about 1,000 sccm. The flow rate of argon may be in the range between about 50 sccm and about 100 sccm.

After the coating removal step as shown in FIG. 7, coating layer 30 is removed along with the AlF particles attached thereon. The removed coating layer 30 and the metal particles are evacuated through pump 14. On the other hand, metal particles such as AlF particles 36 may still remain on gas-flow re-distributor 18, partly because coating layer 30 may not be formed on gas-flow re-distributor 18, and hence the removal of coating layer 30 does not result in the removal of AlF particles 36. An additional in-situ metal cleaning process is then performed to remove AlF particles 36. The respective step is illustrated as step 108 in the process flow 100 FIG. 1.

Figure 8:
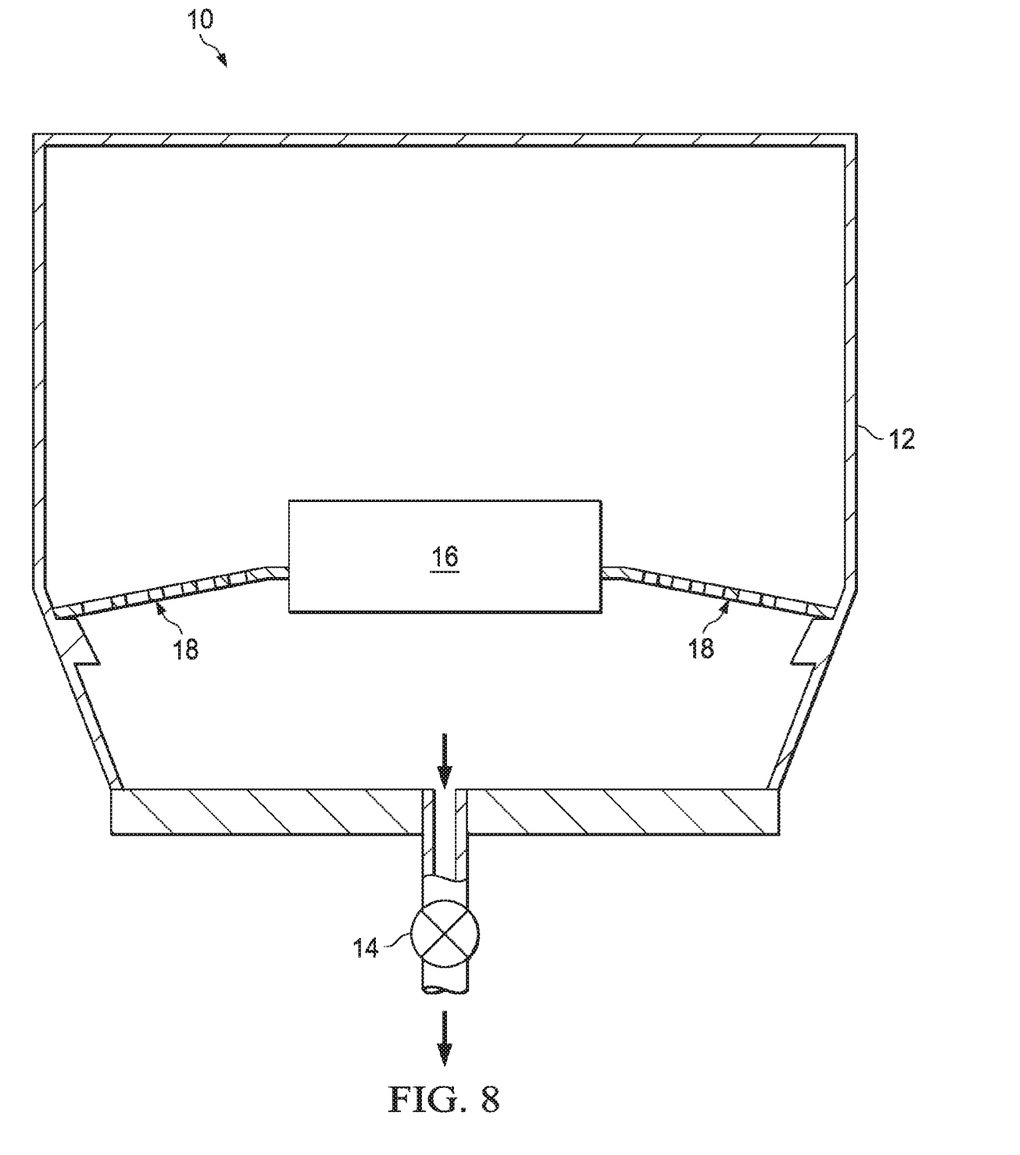

Referring to FIG. 8, in the metal cleaning process, the process gases that can be used to remove metal particles 36 are introduced into chamber 12. For example, when metal particles 36 are AlF particles, chlorine ($Cl_2$) and/or $BCl_3$ gases may be used. $Cl_2$ and $BCl_3$ may be used together to achieve better results. In some exemplary embodiments, the pressure of the etching gas (such as $Cl_2$ and $BCl_3$) is in the range between about 1 mTorr and about 5 mTorr. The power for the etching may be in the range between about 300 Watts and about 800 Watts. The flow rate of $Cl_2$ may be in the range between about 50 sccm and about 200 sccm. The flow rate of $BCl_3$ may be in the range between about 30 sccm and about 100 sccm. The flow rate of argon may be in the range between about 10 sccm and about 100 sccm. In some embodiments, etching tool 10 includes different coils (not shown) encircling different parts of chamber 12, such as the top part, the middle part, and the bottom part. Accordingly, the setting of the coils (such as the current flowing through the coils) may be adjusted, so that the coils encircling gas-flow re-distributor 18 may be provided with a higher current than other coils, and hence the efficiency of the metal cleaning is improved.

In some embodiments of the present disclosure, coating layer 30 is removed before the metal cleaning step. In alternative embodiments, the metal cleaning step is performed before the removal of coating layer 30.

As a result of the metal clean, metal particles 36 are substantially fully removed from chamber 12, and hence the yield of the subsequent process steps will not be affected by the metal particles generated in the cycle shown in FIGS. 4 through 8. Next, referring back to the process flow in FIG. 1, the process loops back to step 102 to etch a subsequent wafer, and the steps 102, 104, 106, and 108 are performed again. The respective process steps are also shown in FIGS. 4 through 8. The cycles may be repeated for a plurality of wafers. In the embodiments of the present disclosure, the etching of each of the wafers is accompanied by the formation and the removal of a coating layer and a metal cleaning of the gas-flow re-distributor. In alternative embodiments, the etching of two wafers, three wafers, or a greater number of wafers is accompanied by the formation and the removal of a coating layer.

The embodiments of the present disclosure have some advantageous features. By forming a coating layer, and then removing the coating layer after the metal etching process, the undesirable metal particles may be adhered tightly to the coating layer, so that the metal particles will not fall on the wafer. The metal particles are removed by removing the coating layer. By forming the coating layer using a relatively high pressure, the top part of the chamber is covered more thoroughly with the coating layer. Since the yield loss is mainly affected to the metal particles falling from the top part of the chamber, the problem of falling particles is eliminated effectively.

In accordance with some embodiments of the present disclosure, method includes forming a coating layer in a dry etching chamber, placing a wafer into the dry etching chamber, etching a metal-containing layer of the wafer, and moving the wafer out of the dry etching chamber. After the wafer is moved out of the dry etching chamber, the coating layer is removed.

In accordance with alternative embodiments of the present disclosure, a method includes placing a wafer into a dry etching chamber, with a gas-flow re-distributor located in the dry etching chamber. The gas-flow re-distributor includes an inner edge encircling a wafer station, with the wafer being placed on the wafer station, an outer edge concentric with the inner edge, and a plurality of through-holes between the inner edge and the outer edge. A metal-containing layer of the wafer is etched. The wafer is then moved out of the dry etching chamber. After the wafer is moved out of the dry etching chamber, an in-situ etching process is performed to remove metal particles from a surface of the gas-flow re-distributor.

In accordance with yet alternative embodiments of the present disclosure, an apparatus includes a dry etching chamber, a wafer station in the dry etching chamber; and a gas-flow re-distributor located in the dry etching chamber. The gas-flow re-distributor separates the chamber into a top portion over the gas-flow re-distributor and a bottom portion under the gas-flow re-distributor. The gas-flow re-distributor includes an inner edge encircling the wafer station, an outer edge concentric with the inner edge, and a plurality of through-holes between the inner edge and the outer edge. The plurality of through-holes connects the top portion of the dry etching chamber to the bottom portion of the dry etching chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a dry etching chamber comprising an inner surface;
   an E-chuck in the dry etching chamber; and
   a coating layer comprising $SiClO_x$ compound, with value x being 3 or 4, wherein the coating layer covers an upper portion of the inner surface of the dry etching chamber, with a lower portion of the inner surface of the dry etching chamber un-covered by the coating layer.

2. The apparatus of claim 1 further comprising a gas-flow re-distributor located in the dry etching chamber, wherein the gas-flow re-distributor comprises a plurality of through-holes therein, wherein the un-covered lower portion of the inner surface of the dry etching chamber is lower than a top surface of the E-Chuck, and higher than the gas-flow re-distributor.

3. The apparatus of claim 1, wherein the coating layer further comprises a metal and fluorine attached thereon to form Si—F-M bonds, with letter F representing fluorine, and letter M representing the metal.

4. The apparatus of claim 3, wherein the coating layer forms Si—F—Al bonds with fluorine and aluminum atoms.

5. The apparatus of claim 1, wherein thicknesses of the coating layer gradually reduce starting from substantially a same level as a top surface of the E-Chuck, with upper portions of a part of the coating layer lower than the top surface of the E-Chuck being thicker than respective lower portions.

6. The apparatus of claim 1 further comprising:
   a gas-flow re-distributor located in the dry etching chamber, wherein the gas-flow re-distributor separates the dry etching chamber into a top portion over the gas-flow re-distributor and a bottom portion under the gas-flow re-distributor, and wherein the gas-flow re-distributor comprises:
      an inner edge encircling the E-Chuck;
      an outer edge concentric with the inner edge; and
      a plurality of through-holes between the inner edge and the outer edge, wherein the plurality of through-holes connect the top portion of the dry etching chamber to the bottom portion of the dry etching chamber.

7. The apparatus of claim 1, wherein the lower portion of the inner surface of the dry etching chamber is exposed to an inner space of the dry etching chamber.

8. The apparatus of claim 1, wherein the coating layer comprises $SiClO_3$.

9. The apparatus of claim 1, wherein the coating layer comprises $SiClO_4$.

10. An apparatus comprising:
a dry etching chamber comprising an inner surface;
an E-chuck in the dry etching chamber; and
a coating layer comprising $SiClO_3$, wherein the coating layer covers an upper portion of the inner surface of the dry etching chamber, with a lower portion of the inner surface of the dry etching chamber un-covered by the coating layer.

11. The apparatus of claim 10 further comprising a gas-flow re-distributor located in the dry etching chamber, wherein the gas-flow re-distributor comprises a plurality of through-holes therein, wherein the un-covered lower portion of the inner surface of the dry etching chamber is lower than a top surface of the E-Chuck, and higher than the gas-flow re-distributor.

12. The apparatus of claim 10, wherein the coating layer further comprises a metal and fluorine attached thereon to form Si—F-M bonds, with letter F representing fluorine, and letter M representing the metal.

13. The apparatus of claim 12, wherein the coating layer forms Si—F—Al bonds with fluorine and aluminum atoms.

14. The apparatus of claim 10, wherein thicknesses of the coating layer gradually reduce starting from substantially a same level as a top surface of the E-Chuck, with upper portions of a part of the coating layer lower than the top surface of the E-Chuck being thicker than respective lower portions.

15. The apparatus of claim 10 further comprising:
a gas-flow re-distributor located in the dry etching chamber, wherein the gas-flow re-distributor separates the dry etching chamber into a top portion over the gas-flow re-distributor and a bottom portion under the gas-flow re-distributor, and wherein the gas-flow re-distributor comprises:
an inner edge encircling the E-Chuck;
an outer edge concentric with the inner edge; and
a plurality of through-holes between the inner edge and the outer edge, wherein the plurality of through-holes connect the top portion of the dry etching chamber to the bottom portion of the dry etching chamber.

16. The apparatus of claim 10, wherein the lower portion of the inner surface of the dry etching chamber is exposed to an inner space of the dry etching chamber.

17. An apparatus comprising:
a dry etching chamber comprising an inner surface;
an E-chuck in the dry etching chamber; and
a coating layer comprising silicon, chlorine, and oxygen, wherein the coating layer covers an upper portion of the inner surface of the dry etching chamber, with a lower portion of the inner surface of the dry etching chamber un-covered by the coating layer, and wherein thicknesses of the coating layer gradually reduce starting from substantially a same level as a top surface of the E-Chuck, with upper portions of a part of the coating layer lower than the top surface of the E-Chuck being thicker than respective lower portions.

18. The Apparatus of claim 17 further comprising a gas-flow re-distributor located in the dry etching chamber, wherein the gas-flow re-distributor comprises a plurality of through-holes therein, wherein the un-covered lower portion of the inner surface of the dry etching chamber is lower than a top surface of the E-Chuck, and higher than the gas-flow re-distributor.

19. The apparatus of claim 17, wherein the coating layer further comprises a metal and fluorine attached thereon to form Si—F-M bonds, with letter F representing fluorine, and letter M representing the metal.

20. The apparatus of claim 17, wherein the coating layer comprises $SiClO_x$, with X being equal to or greater than 1.

* * * * *